US006933677B1

(12) United States Patent
Karpen

(10) Patent No.: US 6,933,677 B1
(45) Date of Patent: Aug. 23, 2005

(54) MAGNETICALLY SHIELDED FLOURESCENT LAMP BALLAST CASE

(76) Inventor: Daniel Nathan Karpen, 3 Harbor Hill Dr., Huntington, NY (US) 11743

( * ) Notice: Subject to any disclaimer, the term of this patent is extended or adjusted under 35 U.S.C. 154(b) by 0 days.

(21) Appl. No.: 09/096,999

(22) Filed: Jun. 13, 1998

Related U.S. Application Data

(63) Continuation-in-part of application No. 08/600,400, filed on Feb. 12, 1996, now abandoned.

(51) Int. Cl.⁷ ................................................ H02B 1/26
(52) U.S. Cl. ........................................ 315/85; 361/674
(58) Field of Search ................................. 361/674, 753; 313/313, 318.01, 318.02; 315/85; 362/376, 265, 261, 221, 263

(56) References Cited

U.S. PATENT DOCUMENTS

| | | | |
|---|---|---|---|
| 3,587,167 A | 6/1971 | Levin .......................... | 29/592 |
| 3,885,150 A | 5/1975 | Ott .......................... | 240/46.39 |
| 4,393,435 A | 7/1983 | Petrina ....................... | 361/377 |
| 4,409,521 A | 10/1983 | Roberts ....................... | 315/57 |
| 4,625,573 A | 12/1986 | Henry ..................... | 73/864.44 |
| 4,656,418 A | 4/1987 | Boston et al. .............. | 324/127 |
| 4,684,810 A | 8/1987 | Fisher et al. ............. | 250/515.1 |
| 4,796,160 A | 1/1989 | Kahn ......................... | 362/19 |
| 4,891,550 A | 1/1990 | Northrop et al. .......... | 313/487 |
| 4,963,827 A | 10/1990 | Popovic et al. ............. | 324/251 |
| 5,122,710 A | 6/1992 | Northrop et al. .......... | 313/487 |
| 5,325,018 A | 6/1994 | El-Hamamsy ............... | 315/85 |
| 5,336,848 A | 8/1994 | Katz ........................... | 174/35 |
| 5,357,061 A | 10/1994 | Crutchfield ................. | 178/18 |
| 5,412,280 A | 5/1995 | Scott et al. ................. | 313/573 |
| 5,446,617 A * | 8/1995 | Blocher et al. ............. | 361/674 |
| 5,607,228 A | 3/1997 | Ozaki et al. ................ | 362/263 |

OTHER PUBLICATIONS

Magnetic Shield Rooms and Modular Enclosures, Magnetic Shield Corp., 1991.*

Magnetic Materials, McGraw–Hill Inc.,pp294–297.*

Co–NETIC & NETIC Magnetic Shielding Alloys for Magnetic Shield Rooms & Modular Enclosing "(CO–NETIC)", Magnetic Shield Corp. Catalog Re–1, Bensenville IL, pp. 1–8, 1991.

"Magnetic Materials" McGraw Hill, Inc. pp. 294–297.

"Danger–High Voltage", Louise Young, *Environment*, vol. 20., No. 4, May 1978. pp. 16–20, 37–38.

Rea, William J. et al "Electromagnetic Field Sensitivity", *Journal of Bioelectricity*, 10 (1+2), pp. 241–256 (1991).

Wilkins, A.J. et al ("Fluorescent Lighting, Headaches and Eye–Strain", *National Lighting Conference*, 1988, p. 1–9.

(Continued)

*Primary Examiner*—David Vu
(74) *Attorney, Agent, or Firm*—Alfred M Walker; Lee Groszkreuz Hechtel

(57) ABSTRACT

A magnetically shielded fluorescent lamp ballast case for shielding human beings from the negative effects of magnetic fields emanating from a fluorescent lamp ballast is made of a ferromagnetic alloy, or lined on the inside or the outside of the fluorescent lamp ballast case with such foil alloys. The ferromagnetic alloy for the magnetically shielded fluorescent lamp ballast case is a soft magnetic material. The soft magnetic material is a metal alloy containing one or more than one of the following elements: iron, nickel, or cobalt. The fluorescent lamp ballast case can be made of steel or aluminum, and lined on the inside or the outside of the ballast case with a ferromagnetic foil alloy which is attached to the steel or aluminum by adhesive. The magnetically shielded fluorescent lamp ballast case for a fluorescent lamp ballast can be employed for core coil fluorescent lamp ballasts or for electronic solid state fluorescent lamp ballasts. There is a substantial attenuation of the magnetic component of the electromagnetic field, particularly of frequencies up to about 100 Kilohertz.

13 Claims, 3 Drawing Sheets

OTHER PUBLICATIONS

"AC/DC Magnetic Field Evaluator Probe HP–103B", Magnetic Shield Corporation, Bensenville, IL, 1992 pp. 1–2.

Bunk, Donald S. et al, "Electromagnetic Shielding," IBM Corp. Kingston, N.Y. p. 1–16.

* cited by examiner

MAGNETICALLY SHIELDED FLOURESCENT LAMP BALLAST CASE

This application is a continuation-in-part of application Ser. No. 08/600,400 filed Feb. 12, 1996. Now abandoned.

BACKGROUND OF THE INVENTION

1. Document Disclosure Reference

The application for patent is based on a disclosure filed on Jun. 26, 1995, as Applicant's previously filed Disclosure Document No. 387,572, under the Document Disclosure Program.

2. Field of the Invention

The invention relates to the shielding of fluorescent ballasts by using a fluorescent lamp ballast case made of a ferromagnetic material to shield it from electromagnetic fields, particularly the magnetic component of the electromagnetic fields up to frequencies of about 100 Kilohertz. Additionally, the fluorescent lamp ballast case may be made of steel or aluminum and lined on the inside or outside with thin ferromagnetic foil alloys.

As used herein and in the appended claims, the term "ballast case" refers to a "fluorescent lamp ballast case". The magnetically shielded fluorescent lamp ballast case can be used for both core coil fluorescent lamp ballasts and for solid state electronic fluorescent lamp ballasts.

3. Description of Related Prior Art

Related prior art concerns itself with the shielding of the fluorescent lamp, or the entire fluorescent fixture, or the reduction of the electromagnetic interference by providing a current path external to an arc discharge lamp so as to produce a magnetic field generally in opposition to the magnetic field generated by the current in the arc discharge, particularly for circular fluorescent lamps. None of the prior art relates to the shielding of the fluorescent ballast from the magnetic component of the electromagnetic field at frequencies of up to about 100 Kilohertz by the use of ferromagnetic shielding materials in the fluorescent lamp ballast case.

For example, Fisher et al. (U.S. Pat. No. 4,684,810, issued Aug. 4, 1987) discloses a cylindrical shield affixed to the opposed marginal terminal end portions of a fluorescent light tube. The shield each include a layer of magnetic substances with intersect X-rays emitted by the cathode of the tube to avoid the harmful effects that are brought about by the X-rays impinging upon people located nearby.

Levin (U.S. Pat. No. 5,587,167, issued Jun. 28, 1971) discloses a novel radio frequency shielding for fluorescent lights comprising a continuous strip of flexible film coated with a layer which is electrically conductive and capable of transmitting light, said film being formed into a closure and surrounding said fluorescent lamp.

Ott (U.S. Pat. No. 3,885,150, issued May 20, 1975), discloses an improved radiation shielded luminaire utilizing gas discharge lamps. Shielding of radio frequency radiation is provided by a grounded superimposed screen and louver assembly. Additional shielding around the cathode area of the lamp shields radiation in the frequency ranges of X-ray and infrared radiation.

Roberts (U.S. Pat. No. 4,409,521, issued Oct. 11, 1983) teaches that the electromagnetic interference produced by arc discharge lamps and other devices operating at frequencies in excess of 15,000 Hertz can be reduced by providing a current path external to the envelope containing the discharge, the current flow in the path being oriented so as to produce a magnetic field generally in opposition to the magnetic field generated by the current in the arc discharge. This invention is particularly applicable to circular fluorescent lamps with a centrally disposed ballast operating at relatively high frequencies.

Ferromagnetic materials have been used for magnetic shielding of a number of devices. For example, Katz (U.S. Pat. No. 5,336,848, issued Aug. 9, 1994) teaches the use of Co-Netic alloy for the shielding of a lap-top computer. Additionally, Crutchfield (U.S. Pat. No. 5.357.061, issued Oct. 18, 1994)) teaches the use of Co-Netic alloy for the shielding of a digitizer tablet. Henry (U.S. Pat. No. 4,625,573, issued Dec. 2, 1986), teaches the use of various ferromagnetic alloys for a magnetically shielded borehole core drilling device. Furthermore, Popovic et al. (U.S. Pat. No. 4,963,827, issued Oct. 15, 1990) teaches the use of mu-metal for an intermittently activated magnetic shield arrangement for reducing noise and offsets in solid state magnetic field sensors.

Petrina (U.S. Pat. No. 4,393.435, issued Jul. 11, 1983) discloses a ballast coil, transformer, and power factor capacitor that are plug mounted on a PC-board which is mounted in a frame being covered to provide a complete, unpotted structure. However, Petrina does not disclose any electromagnetic shielding of the ballast case.

Ozaki et. al. (U.S. Pat. No. 5,607.228) teaches an automtive headlamp capable of effectively shielding the electromagnetic waves generated by the discharge lamp of a light source, using a conductive layer composing several layers of durable magnetic plating. Ozaki shields the lamp, not the ballast. Also, Ozaki uses an electrically conductive shielding material, not a magnetic shielding material. Ozaki uses layers of pure metal plating; not an alloy of nickel and iron.

Blocher et al. (U.S. Pat. No. 5,446,617, issued Aug. 29, 1995) discloses a ballast circuit and grounding structure for electrically grounding a ballast circuit to a housing and for capturing transmitted RFI and EMI therefrom. Good shielding efficiency for plane waves or electric (high impedance) fields is obtained by using materials of high conductivity such as copper and aluminum. However, low-frequency magnetic fields are more difficult to shield because the reflection and absorption losses of non-magnetic materials, such as aluminum, may be insignificant. Consequently, to shield against low-frequency magnetic fields, it is necessary to use magnetic shielding materials.

4. Theory of the Invention

In the design of the electrical circuit for a fluorescent lamp ballast, a transformer, inductor, or other magnetic components are included in the ballast. If a fluorescent lamp ballast contains such components, then alternating current flowing through these components gives rise to electromagnetic fields of various frequencies.

In a core coil fluorescent lamp ballast, the magnetic fields are 60 Hertz. There may be multiples of the 60 cycle magnetic fields produced from harmonics in the circuitry.

In the last ten years, the fluorescent lamp ballast industry has been shifting to solid state ballasts. These fluorescent lamp ballasts contain rectifier and inverter circuitry. The inverter circuit provides alternating current generally between 20,000 Hertz and 50,000 Hertz to drive the fluorescent lamp. There are three types of inverter circuits. The self excited inverter has the input winding, the output winding, and the feedback winding on the same core. The flip flop occurs because of the saturation of the core. These circuits produce strong microphonics, and the external fields are high because of saturation of the main core on each half circuits. The self excited inverter has the input winding, output winding, and feedback winding on the same core. The flip flop occurs because of the saturation of the core. These circuits produce strong microphonics, and the external fields are high because of saturation of the main core on each half cycle. A second type, the separate oscillator excited inverter, has a transformer designed to saturate at 40 Hertz. However, because the transformer is operating at 60 Hertz, it does not saturate at that frequency. It uses a separate oscillator running at 60 Hertz feeding a power transistor. Typically, these circuits produce 20 DB less of external magnetic fields and microphonics. A third type, the self excited with a separate saturable core, has the saturable core wired between the feedback winding of the main core and input to the power transistor. A small transformer in the feedback circuit does the saturating but carries no substantial power.

Many people working under or near fluorescent lighting may feel tired, fatigued, stressed out, or having headaches, eyestrain, or blurred vision. The cause of these problems may be unpolarized illumination or poor quality light sources that have correlated color temperatures below 5,000 degrees Kelvin. However, even in the presence of polarized illumination using full-spectrum lamps, a number of very sensitive individuals may be affected by extremely low levels of electromagnetic fields. Both the 60 Hertz fields and the 20,000 to 50,000 Hertz fields may affect people. It is suspected that field strengths as low as 1 microgauss or lower may affect sensitive individuals. Thus, there is a need for shielding of the fluorescent lamp ballast case of the fluorescent lamp ballast to attenuate the electromagnetic fields, and in particular, the magnetic components of the electromagnetic fields.

OBJECT AND SUMMARY OF THE INVENTION

The object of the subject invention is to provide a magnetically shielded fluorescent lamp ballast case for a fluorescent lamp ballast free of the magnetic fields which can affect people in a space, by shielding the magnetic component of the electromagnetic field with a magnetic shielding material.

The magnetic shielding is a soft magnetic material, generally a ferromagnetic alloy containing one or more of the following elements: iron, nickel, or cobalt. Additionally, the magnetically shielded fluorescent lamp ballast case can be made of aluminum or steel, and lined on the inside or outside with a ferromagnetic alloy foil, which is attached with pressure sensitive tape or adhesive. Such magnetic shielding will provide a substantial attenuation of the magnetic component of the electromagnetic fields, particularly in the frequencies up to about 100 Kilohertz.

DESCRIPTION OF THE DRAWINGS

The present invention can be best understood in conjunction with the accompanying drawings.

DETAILED DESCRIPTION OF THE DRAWINGS

Figure 1:
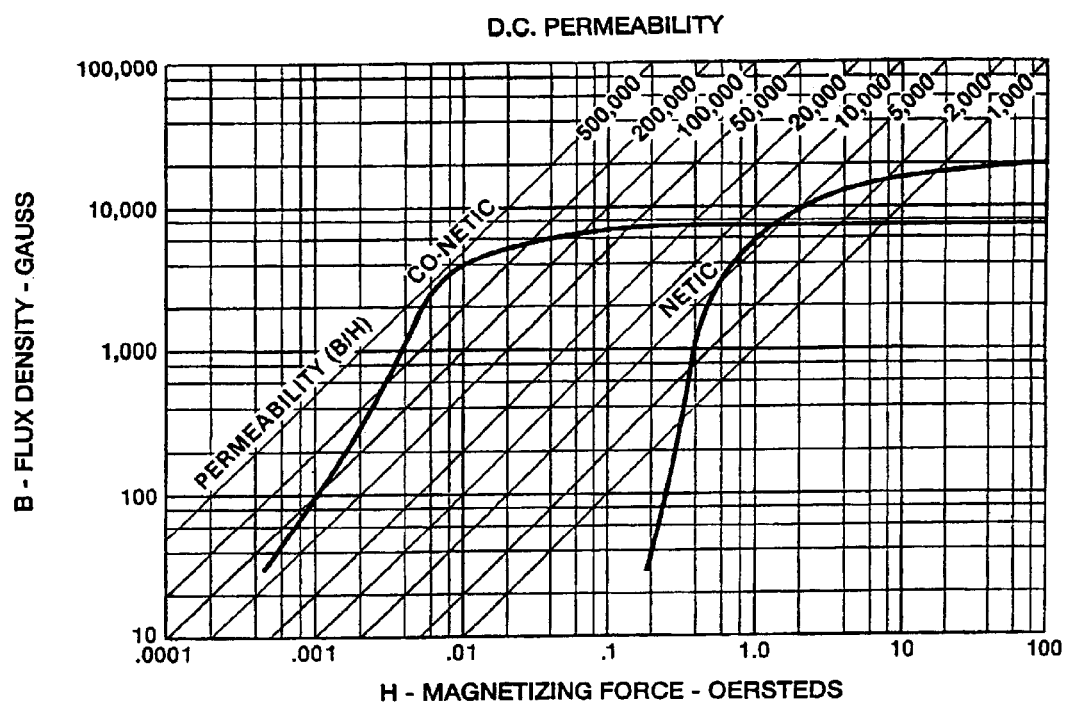
FIG. 1 is a graph showing the relationship between the magnetizing force H in oersteds and the flux density B in gauss for two types of ferromagnetic alloys.

FIG. 1 is a graph showing the relationship between the magnetizing force H in oersteds and the flux density B in gauss for two types of ferromagnetic alloys, Co-Netic and Netic. The vertical axis represents the flux density and the horizontal axis represents the magnetizing force. Also note that the graph shows permeability, B/H, and that the maximum permeability of Co-Netic which is about 450,000 occurs when the flux density is between 2,500 and 3,500 gauss.

Figure 2:
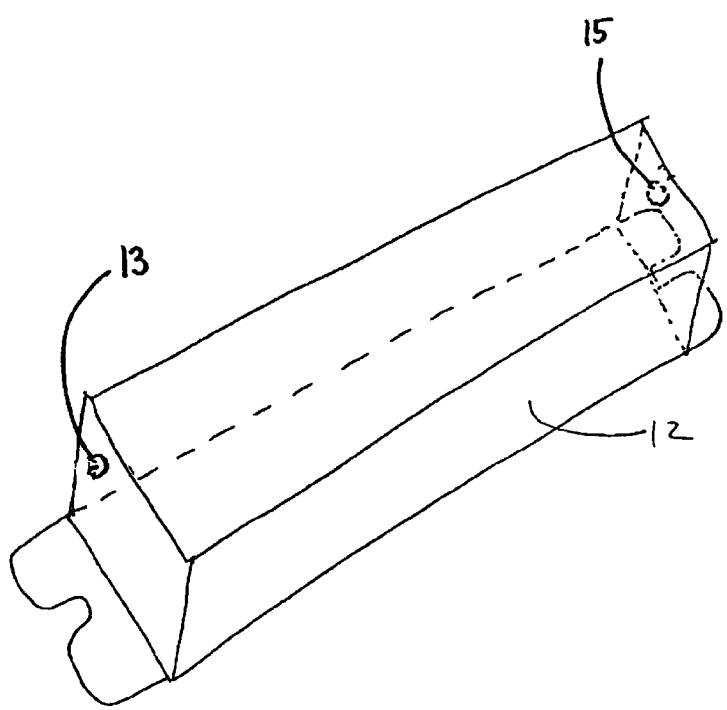
FIG. 2 is perspective view of a magnetically shielded fluorescent lamp ballast case of the present invention.

FIG. 2 shows a fluorescent lamp ballast case 12 made of a stamped ferromagnetic alloy. The entire fluorescent lamp ballast case 12 is made of the ferromagnetic alloy. The only penetrations in the case are holes 13, 15 for the external wiring (not shown).

Figure 3:
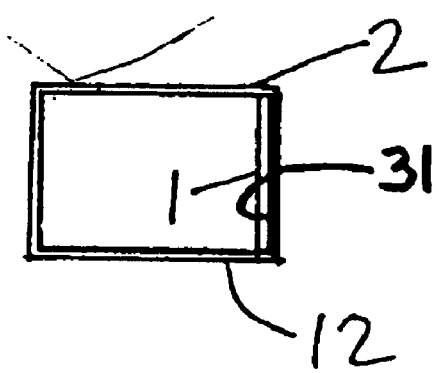
FIG. 3 is a cross sectional end view of a magnetically shielded fluorescent lamp ballast case with an outer shielding foil alloy shielding material which is attached with adhesive.

FIG. 3 shows a cross section of the fluorescent lamp ballast case 12 perpendicular to the long axis. FIG. 3 also shows the fluorescent lamp ballast case 12 being lined on the outside with a ferromagnetic foil alloy. The entire outside of the fluorescent lamp ballast case is lined with the foil alloy, the only exception being holes to insert the external wiring (external wiring not shown). In FIG. 3, 1 refers to the aluminum or steel case, and 2 to the foil alloy lining on the outside of the fluorescent lamp ballast case 12. There is an adhesive layer 31 between the aluminum or steel case 1 and the foil alloy 2.

Figure 4:
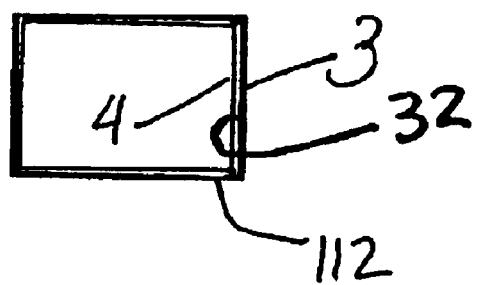
FIG. 4 is a cross sectional end view of a magnetically shielded fluorescent lamp ballast case with an inner shielding foil alloy material which is attached with adhesive.

FIG. 4 also shows a cross section of an alternate embodiment for a fluorescent lamp ballast case 112 perpendicular to the long axis. It shows the fluorescent lamp ballast case 112 being lined on the inside by the ferromagnetic foil alloy. The entire inside of the ballast case 112 is lined with the foil alloy, the only exception being the holes for inserting the external wiring (external wiring not shown). In the figure, 3 refers to the aluminum or steel case, and 4 to the foil alloy lining on the outside of the fluorescent lamp ballast case 112. There is an adhesive layer 32 between the aluminum or steel case 3 and the foil alloy 4.

DETAILED DESCRIPTION OF THE PREFERRED EMBODIMENT

A detailed description of the types of materials which can be used for shielding of the fluorescent lamp ballast case 12 or fluorescent lamp ballast case 112 is provided below. Magnetic materials are classified as soft or hard according to the ease of magnetization. Soft magnetic materials are used in devices in which the change in the magnetization duing operation is desirable, and these materials are characterized by their low loss and high permeability. Certain alloys make excellent shielding materials. As used herein and in the appended claims, a material or metal alloy is "ferromagnetic" if it has at least one of the following elements: iron, nickel, or cobalt. As used according to certain aspects of the invention, the ferromagnetic alloy employed is characterized by an initial magnetic permeability of at least 200 gauss/oersted, most preferably at least 2,000 gauss/oersted. With respect to the meaning of "initial magnetic permeability", the more general term, "magnetic permeability", will first be defined. "Magnetic permeability", as used herein is "absolute magnetic permeability" M. M=B/H, where B is the flux density produced in the material in question by a magnetic field, and where H is the intensity of the field. As known to those skilled in the art, the permeability of ferromagnetic materials is not constant, but is dependent upon the intensity of the magnetic field to which they are exposed. As used herein and in the appended claims, the term "initial magnetic permeability" is defined as the limit approached by the magnetic permeability for a particular material as B and H are decreased toward zero. Employing a ferromagnetic material having the initial magnetic permeability characteristics described above provides effective magnetic shielding for fluorescent lamp ballast case 12 or fluorescent lamp ballast case 112.

Some examples of commercially available metallic alloys having the permeability characteristics described above include the following, wherein compositions of the alloys are given in parenthesis in terms-of percent weight: 4–79 PERMALLOY (4% Mo, 79% Ni, 17% Fe), SUPERMALLOY (5% Mo, 79% Ni, 16% Fe)d, 1040 alloy (3% Mo, 14% Cu, 72% Ni, 11% Fe), MUMETAL (5% Cu, 2% Cr, 77% Ni, 16% Fe), RHOMETAL (36% Ni, 64% Fe), SINIMAX (43% Ni, 54% Fe, 3% Si), MONIMAX (48% Ni, 49% Fe, 3% Mo), 45 PERMALLOY (45% Ni, 55% Fe), 4750 (also ARMCO 48 Ni, CARPENTER 49 ALLOY, 47–50% Ni, 50–53% Fe), HIPERNIK, HIPERNIK V, 48 ORTHONIX, DELTAMAX, ISOPERM (all 50% Ni, 50% Fe), and 78 PERMALLOY (78% Ni, 22% Fe). Reference may be made to the McGraw-Hill Encyclopedia of Science and Techology, 7th Edition, 1992, Volume 10, page 295, and to Chih-Wen-Chen, "Magnetism and Metallurgy of Soft Magnetic Materials", Dover Publications, 1986, pp. 386–387 for a listing of the initial permeabilities and coercivities for these alloys. In addition, these alloys are commercially available from a number of sources. For example. Spang Specialty Metals of Butler, Pennsylvania supplies PERMALLOY 78, MAGNASHIELD-24, MUMETAL, ALLOY 78, BLENDALLOY 25-2025, and BLENDALLOY 25-8004. EAGLE AAA, EAGLE AA, and EAGLE A sheet stock are available from Eagle Magnetic Company, Indianapolis, Ind. CO-NETIC AA, CO-NETIC B, and NETIC sheet stock are available from the Magnetic Shield Corporation, Perfection Mica Company, Bensenville, Ill. Another source for magnetic shielding suitable for use with fluorescent lamp ballast case 12 or fluorescent lamp ballast case 112 of the present invention are AD-MU-00, AD-MU-48, and AD-MU-78, and AD-MU-80 sheet stock, manufactured by Ad-Vance Magnetics of Rochester, Ind. Carpenter Technology, Carpenter Steel Division, in Reading, Pa., also supplies high permeability alloys such as CARPENTER "49" alloy, HYMU "80" alloy, HIPERNOM, and related products. Other materials may be available from other suppliers of soft magnetic alloys. Although cobalt containing soft magnetic alloys are not presently employed, primarily due to cost and difficulties of manufacture, they do have excellent magnetic properties. Cobalt containing alloys include such materials as PERMINVAR and PERMENDUR. Other soft magnetic alloys, such as SENDUST, are extremely brittle, and can not be manufactured into sheet form. Although not presently employed, various metallic glasses could also be employed as the ferromagnetic material; such metallic glasses consisting primarily of iron, cobalt, or nickel, and also consisting of a metalloid such as boron or phosphors or other metallic constituents. There are also amorphous substances such as METGLAS that can be used as a shielding material; however, it is manufactured in very narrow strips and would not be employed in the invention.

The CO-NETIC AA, NETIC S3-6, EAGLE "AAA", and ADVANCE AD-MU series alloys are available in foil alloy form with pressure sensitive adhesive tape, and can be placed on mild steel sheet or aluminum as another way of providing magnetic shielding.

Magnetic shielding relies on the induction of the impinging magnetic flux into the shielding alloy, bypassing the enclosed apparatus. A magnetic shield provides a low reluctance magnetic path for the interference field. The shield attracts flux lines to itself and diverts the magnetic field away from the sensitive components.

According to literature provided by Perfection Mica Company (AC/DC Magnetic Field Evaluator Probe HP-103B, Catalog HP-2), both the CO-NETIC AA and the NETIC S3-6 magnetic shielding alloys provide attenuation of magnetic field interference in the DC to 100 Kilohertz range. This is exactly the frequencies of the magnetic fields found in both core-coil fluorescent lamp ballasts and solid state electronic fluorescent lamp ballasts.

A fluorescent lamp ballast for 1F40 or 2F40 lamps, employing fluorescent lamp ballast case 12 or ballast case 112, or for the T-8 lamps, is generally about 8.25 inches long, 2.5 inches wide, and about 1.5 inches high. Lighting industry standards provide that integral mounting clips are used to hold the ballasts in place in luminaires.

There are several formulas that can be used to determine the degree of attenuation that can be achieved by shielding a fluorescent lamp ballast case 12 or fluorescent lamp ballast case 112 with magnetic shielding alloys. The flux density in the shielding alloy is given by the following formula:

$$B_m = \frac{1.25 \times D \times H_o}{t}$$

where $B_m$ is the Flux Density in the alloy (Gauss), t is the thickness of the layer in inches, $H_o$ is the outside field strength in oersteds, and D is the diameter of the cylindrical shield. In the case of a rectangular fluorescent lamp ballast case, such as fluorescent lamp ballast case 12 or fluorescent lamp ballast case 112, it can be assumed that a rectangular case approximates a cylindrical shield, and if the length of the cylindrical shield is 4 times the diameter, this approximation is satisfactory to use to determine the attenuation. Note in the formula that a minimum of 0.5 Oersteds must be used to assure that the Earth's field does not saturate the enclosure preventing shielding of alternating current fields. Now refer to FIG. 1 to find M, which is the permeability corresponding to $B_m$ on the vertical scale. If $B_m$ exceeds the saturation limit for the alloys shown on the graph (7,500 Gauss for CO-NETIC. 21,000 Gauss for NETIC), see page 6, "Magnetic Shield Rooms and Modular Enclosures". Magnetic Shield Corp., Bensenville, Ill., literature catalog RE-1. However, for the shielding of fluorescent lamp ballast case 12 or fluorescent lamp ballast case 112, where the outside field is on the order of 1 to 5 Gauss maximum, the maximum flux density should not exceed these limits. The attenuation factor is calculated by multiplying the permeability by the thickness of the shielding alloy, and dividing by the diameter of the cylindrical shield or the diagonal of the largest face of a rectangular box, such as fluorescent lamp ballast case 12 or fluorescent lamp ballast case 112, in inches. Designing for a DC field provides a maximized shield in AC fields of equal density (AC Peak).

Two calculations are provided below. The first calculation is the attenuation obtained by using 0.014 inches thick NETIC shielding material, and the second is for CO-NETIC shielding material. For a fluorescent lamp ballast case 12, it is assumed that the ballast case can approximate a cylindrical shield. In this approximation, the diameter of a ballast, by actual measurement, was 2.75 inches. It will be assumed that at the surface of the ballast case, there is one Oersted. Thus, the flux density in the alloy is 245 Gauss, according to the above formula.

Referring to FIG. 1, for a flux density of 245 Gauss, the permeability is 900. Thus, the attenuation factor for the magnetic field from the fluorescent ballast is 4.6. For use of the CO-NETIC shielding material, which has much higher permeability properties, the flux density in the shielding alloy is 150,000. Assuming a thickness of 0.014 inches in the CO-NETIC shielding alloy, the attenuation factor is 764.

A layer of CO-NETIC foil alloy lining the inside or the outside of the ballast case 12 or ballast case 112, the foil alloy being 0.002 inches thick, provides an attenuation factor of 218. In this calculation, the flux density in the shielding material is 1720 gauss, which gives a permeability of 300,000, according to FIG. 1.

The fluorescent lamp ballast case can be stamped out of sheet metal on a punch press. It can be made of the alloys PERMALLOY 78, MAGNASHIELD-24, MUMETAL, ALLOY 73, BLENDALLOY 25-2025, BLENDALLOY 25-8004, EAGLE AAA, EAGLE AA, EAGLE A, CO-NETIC AA, CO-NETIC B, NETIC, AD-MU-00, AD-MU-48, AD-HU-78, AD-MU-80, CARPENTER "49" alloy, HYMU "80", HIPERNOM, or related products.

Fluorescent lamp ballast case 12 or fluorescent lamp ballast case 112 can be made of aluminum or steel, and lined on the inside or outside by foil alloys such as CO-NETIC AA, NETIC, EAGLE "AAA", AD-MU-00, AD-MU-48, AD-MU-78, AD-MU-80, or similar products. The foil alloy is held on to the aluminum or steel by adhesive.

Modifications can be made to the method used for making the device, the device itself as well as the process described in the magnetically shielded lamp ballast case without departing from the spirit and scope of the invention as exemplified below in the appended claims.

I claim:

1. A magnetically shielded fluorescent lamp ballast case for shielding humans from harmful effects of the magnetic component of electromagnetic fields emitted from a fluorescent lamp ballast, by reducing the magnetic component of the electromagnet fields emitted from the electrical and electronic components within said fluorescent lamp ballast, particularly the magnetic component of said electromagnetic fields between 60 Hertz and 100 Kilohertz, comprising:
   a generally rectangular fluorescent lamp ballast case enclosing said electrical and electronic components, said fluorescent lamp ballast case having holes in said fluorescent lamp ballast case to insert external connecting wiring;
   said fluorescent lamp ballast case being made of a shielding material absorbing the magnetic component of the electromagnetic fields;
   said magnetic shielding material being a soft ferromagnetic metal alloy having an initial magnetic permeability of at least 200 gauss/oersted, and,
   said magnetic shielding material providing attenuation of magnetic fields up to 100 Kilohertz.

2. The fluorescent lamp ballast as in claim 1 further comprising said ferromagnetic alloy further comprising an alloy containing at least one element selected from the group consisting of iron, nickel, or cobalt.

3. The fluorescent lamp ballast as in claim 1 further comprising said soft ferromagnetic alloy characterized by preferably having a magnetic permeability at least 2,000 gauss/oersted.

4. The fluorescent lamp ballast as in claim 1 further comprising said soft ferromagnetic alloy being selected from the group consisting of 4-79 Permalloy, Supermalloy, 1040 alloy, Mumetal, Rhometal, Sinimax, Monimax, 45 Permalloy, 4750, Armco 48 Ni, Carpenter 49 Alloy, 47–50% Ni, 50–53% Fe, Hipernik, Hipernik V, 48 Orthonik, Deltamax, Isoperm, 7B Permalloy, Permalloy 78, MagneSHIELD-24, ALLOY 78, Blendalloy 25-2025, Blendalloy 25-8004, Eagle AAA, Egale AA, Eagle A, Co-Netic AA, Co-Netic B, Netic, AD-MU-00, AD-MU-48, AD-MU-78, AD-MU-80, HyMu "80" alloy, and Hypernom.

5. A magnetically shielded fluorescent ballast case for shielding humans from the harmful effects of the magnetic component of electromagnetic fields emitted from a fluorescent lamp ballast, by reducing the electromagnetic fields emitted from the electrical and electronic components within said fluorescent lamp ballast, particularly the magnetic component of said electromagnetic fields between 60 Hertz and 100 Kilohertz, comprising:
   a generally rectangular fluorescent lamp ballast enclosing said electrical and electronic components, said fluorescent lamp ballast having holes in said fluorescent lamp ballast case to insert external connecting wiring;
   said fluorescent lamp ballast case lined with a magnetic shielding material liner,
   said magnetic shielding material liner being a soft ferromagnetic metal foil alloy having nickel and an initial magnetic permeability of at least 200 gauss/oersted,
   said soft ferromagnetic metal foil alloy being attached with adhesive to said ballast case; and
   said magnetic shielding material liner providing attenuation of magnetic fields up to 100 Kilohertz.

6. The fluorescent lamp ballast as in claim 5 further comprising said soft ferromagnetic alloy characterized by preferably having a magnetic permeability at least 2,000 gauss/oersted.

7. The fluorescent lamp ballast as in claim 6 further comprising said soft ferromagnetic alloy being including a component selected from the group consisting of cobalt, iron, Netic, AD-MU-00, AD-MU-48, AD-MU-78, AD-MU-80, Eagle AAA, and Co-Netic AA.

8. The fluorescent lamp ballast as in claim 7 further comprising said foil layer being external to said ballast case.

9. The fluorescent lamp ballast as in claim 7 further comprising said foil layer being internal to said ballast case.

10. The fluorescent lamp ballast case as in claim 1, further comprising said soft ferromagnetic alloy characterized by having a thickness of about 0.014 inches.

11. The fluorescent lamp ballast case as in claim 1, further comprising said soft ferromagnetic alloy characterized by having an attenuation factor of about 4.6.

12. The fluorescent lamp ballast case as in claim 5, further comprising said soft ferromagnetic alloy characterized by having a thickness of about 0.002 inches.

13. The fluorescent lamp ballast case as in claim 5, further comprising said soft ferromagnetic alloy characterized by having an attenuation factor of about 218.

* * * * *